United States Patent
Houng et al.

(10) Patent No.: US 6,689,645 B2
(45) Date of Patent: Feb. 10, 2004

(54) METHOD OF SURFACE TREATMENT ON THE IMPROVEMENT OF ELECTRICAL PROPERTIES FOR DOPED SILICON OXIDES ($SIO_2$) FILMS

(75) Inventors: Mau-Phon Houng, Tainan (TW); Yeong-Her Wang, Tainan (TW); Wai-Jyh Chang, Tainan (TW)

(73) Assignee: National Science Council, Taipei (TW)

( * ) Notice: Subject to any disclaimer, the term of this patent is extended or adjusted under 35 U.S.C. 154(b) by 318 days.

(21) Appl. No.: 09/851,974

(22) Filed: May 10, 2001

(65) Prior Publication Data

US 2002/0102775 A1 Aug. 1, 2002

(30) Foreign Application Priority Data

Dec. 5, 2000 (TW) .......................... 89126033

(51) Int. Cl.[7] ................ H01L 21/335; H01L 21/8232
(52) U.S. Cl. ...................................... 438/143
(58) Field of Search ........................ 438/400, 404, 438/478, 507, 695, 694, 779, 787

(56) References Cited

U.S. PATENT DOCUMENTS

| | | | | |
|---|---|---|---|---|
| 3,969,485 A | * | 7/1976 | Flemmert | 423/240 R |
| 4,778,532 A | * | 10/1988 | McConnell et al. | 134/10 |
| 5,506,006 A | * | 4/1996 | Chou et al. | 427/430.1 |
| 5,525,535 A | | 6/1996 | Hong | |
| 5,529,946 A | | 6/1996 | Hong | |
| 5,547,900 A | | 8/1996 | Lin | |
| 5,612,239 A | | 3/1997 | Lin et al. | |
| 5,648,128 A | | 7/1997 | Yeh et al. | |
| 5,783,495 A | * | 7/1998 | Li et al. | 134/1.3 |
| 5,849,625 A | | 12/1998 | Hsue et al. | |
| 5,854,101 A | | 12/1998 | Wu | |
| 5,937,281 A | | 8/1999 | Wu | |

FOREIGN PATENT DOCUMENTS

| | | |
|---|---|---|
| TW | 227072 | 7/1994 |
| TW | 327694 | 3/1998 |
| TW | 333668 | 6/1998 |
| TW | 353794 | 3/1999 |
| TW | 377466 | 12/1999 |
| TW | 388123 | 4/2000 |

OTHER PUBLICATIONS

W. Kern, "Handbook of Semiconductor Wafer Cleaning Technology" Science, Technology and Applicantions, Noyes Publications, New Jersey, 1993, pp. 109–151.*

* cited by examiner

Primary Examiner—W. David Coleman
(74) Attorney, Agent, or Firm—Robert E. Bushnell, Esq.

(57) ABSTRACT

In the fabrication of gate oxides in IC process, a suitable cleaning/etching process is required to remove the native oxides and reduce surface microroughness in addition to standard RCA cleaning. For ultrathin oxide thickness (<10 nm), it is an important issue to have a native-oxide-free and H-passivated silicon (Si) surface to ensure high breakdown field, high charge-to-breakdown, and low leakage current. According to these concepts, we propose an invention with a simple two-step hydrogen fluoride (HF) etching process to improve the electrical properties of liquid-phase deposited fluorinated silicon oxides (LPD-SiOF), including effective removal of native oxides, lowering of interface trap density ($\sim 10^{10}$ eV–1 cm$^{-2}$), reduction of surface microroughness (Ra=0.1 nm), and raising of breakdown field (~9.7 MV/cm). Furthermore, rapid thermal annealing (RTA) is also used to further improve the oxide quality. It is found that 18% increase of breakdown field and 33% reduction of interface trap density can be reached. In addition to the suitability for LPD-silicon oxides ($SiO_2$), this technique is also suitable to other doped oxides. This technology is helpful to obtain a high quality and low cost silicon oxide for the ultrathin gate oxide in the future ULSI process.

19 Claims, 7 Drawing Sheets

METHOD OF SURFACE TREATMENT ON THE IMPROVEMENT OF ELECTRICAL PROPERTIES FOR DOPED SILICON OXIDES (SIO₂) FILMS

FIELD OF THE INVENTION

This invention introduces a simple two-step hydrogen fluoride (HF) etching method to enhance the electrical characteristics of liquid-phase deposited fluorinated silicon oxides (LPD-SiOF).

BACKGROUND OF THE INVENTION

During the development of oxide layer in integrated circuit production, in addition to standard RCA cleaning process, an appropriate surface treatment or etching technique is required to effectively remove native oxide and reduce surface microroughness. When the thickness of oxide layer is reduced to less than 10 nm, silicon (Si) surface should be free of any native oxide and fully hydrogen-passivated to ensure that the oxide layer has a high breakdown field, high charge-to-breakdown, and low leakage current.

DESCRIPTION OF THE PRIOR ART

We have discovered from the various publications in the literature that common surface cleaning process could be divided into two main groups, i.e., dry etching by R. Kroon (*Jpn. J. Appl. Phys.* Vol. 36, pp. 5068, 1997) and wet etching by R. K. Chanana and S. K. Srivastava, (*IEEE Int. Conf. Plasma Science*, pp. 282, 1996). In dry etching, M. Biavati et al. (*J. Vac. Sci. & Technol.*, Vol. B13, pp. 2139, 1995) and G. Y. Pavlov (*Mat. Res. Soc. Symp.*, PV. 386, pp. 321, 1995) have reported that plasma etching not only could effectively remove the oxygen ion ($O^{31}$) on silicon (Si) surface, it could also increase the value of charge-to-breakdown. However the lattices on the silicon (Si) surface could be damaged by the plasma, resulting in further surface microroughness.

Other latest developments in dry etching include laser cleaning reported by G. Vereecke et al. (*4th Int. Symp. Ultra Clean Processing of silicon Surfaces*, pp. 187, 1998) or H. Park et al. (*Electrochem. & Solid-State Lett.*, Vol. 1, pp. 77, 1998) reported using various gases including hydrogen fluoride (HF)/methanol (MeOH); ultraviolet (UV)/chlorine gas ($Cl_2$); ultraviolet (UV)/oxygen gas ($O_2$) etc. to clean the Si surfaces. On the other hand, H. Habuka et al. (*J. Cryst. Growth*, Vol. 186, pp. 104, 1998) suggested cleaning with hydrogen fluoride (HF) or hydrogen chloride gases (HCl (g)) under atmospheric pressure or $H_2$ environment or R. Sugino et al. (*J. Electrochem. Soc.*, Vol. 144, pp. 3984, 1997) mentioned using laser on chloride gas ($Cl_2$) to produce chloride ion ($Cl^-$), and the list goes on. These techniques have been proven to remove micro-particles, native oxide, and iron pollutants completely. However when compared to wet etching, this procedure could not solve the problems of total removal of calcium ions and surface microroughness. Therefore some simple and effective wet etching methods still play an important role in integrated circuit (IC) production.

Currently the most effective wet etching method uses the chemically oxidized reaction of hydrogen peroxide ($H_2O_2$) on silicon (Si) to form an oxide layer, which will be removed by hydrogen fluoride (HF) etching in the later step. Based on this theory, numerous novel methods have been published in various renowned periodicals: M. Alessandri et al. (*4th Int. Symp. Ultra Clean Processing of silicon Surfaces*, pp. 27, 1998) suggested hydrogen fluoride (HF)/ultrapure deionized water (D. I. water)/ozone ($O_3$)/ultrasonic cleaning method. T. Hattori et al. (*J. Electrochem. Soc.*, Vol. 145, pp. 3278, 1997) reported using ozone treated D.I. water/diluted hydrogen fluoride (HF). T. Ohmi et al. (*IEICE Trans. Electrons*, Vol. E75-C, pp. 800, 1992) reported modified RCA cleaning method. T. H. Park et al. (*J. Electrochem. Soc.*, Vol. 142, pp. 571, 1995) reported nitric acid ($HNO_3$)/hydrogen fluoride (HF) cleaning system. S. Verhaverbeke et al. (*Symp. VLSI Tech. Dig. Tech. Papers*, pp. 22, 1992) suggested the hydrogen fluoride (HF)-last cleaning step. T. Shimono et al. (*IEICE Trans Electrons*, Vol. E75-C, pp. 812, 1992) mentioned hydrogen fluoride (HF)/hydrogen peroxide ($H_2O_2$) method etc. Those cleaning methods could effectively reduce surface microroughness and provide a more completely hydrogen-passivated surface, thus forming an oxide layer of extremely high quality from the furnace oxidation production.

Based on the above articles, the wafer pre-cleaning process in liquid-phase deposition method could be generally divided into two groups: C. J. Huang et al. (*J. Vac. Sci. & Technol.* Vol. A16, pp. 2646, 1998) reported applying diluted hydrogen fluoride (HF) to remove native oxide, while M. P. Houng et al. (*Mater Chem. & Phys.*, Vol. 59, pp. 36, 1999) suggested immersing in a mixed solution of acetone, methanol, and hydrogen fluoride (HF). Basically these are considered standard RCA cleaning with hydrogen fluoride (HF) etching, and the metal oxide semiconductor (MOS) devices produced generally expressed relatively good electrical characteristics: breakdown field of 8~9 MV/cm and interface electrical charge~$10^{11}$ $eV^{-1}cm^{-2}$. However there are yet to have articles related to the effects of surface treatment or etching on the characteristics of liquid-phase-deposited silicon oxides (LPD-SiOF). As the growth mechanism of liquid-phase deposition differs from furnace oxidation method, the surface quality will directly affect the deposition of silicon oxide film that will then enormously affect the interface characteristics.

The proposal of our invention will not only maintain the high quality in silicon oxide ($SiO_2$) film and extend the application ranges of liquid-phase deposition method, it could provide further development in future ultra-large-scale integrated circuit (ULSI) production especially in gate oxide layer.

SUMMARY OF THE INVENTION

Our proposal introduces a kind of simple two-step hydrogen fluoride (HF) etching method that could improve the electrical characteristics of liquid-phase-deposited fluorinated silicon oxides (LPD—SiOF) including effective removal of native oxides, lowering of interface trap density (~$10^{10}$ $eV^{-1}cm^{-2}$), reduction of surface microroughness (Ra=0.1 nm), and raising of breakdown field (~9.7 MV/cm).

While the invention is susceptible to various modifications and alternative forms, certain illustrative embodiments thereof have been shown by way of example in the drawing and will herein be described in detail.

BRIEF DESCRIPTION OF THE DRAWINGS

The invention will now be described by way of example with reference to the accompanying tables and figures in which:

Tables

Table 1 Six different types of surface etching solutions for Si.

Figure 1:
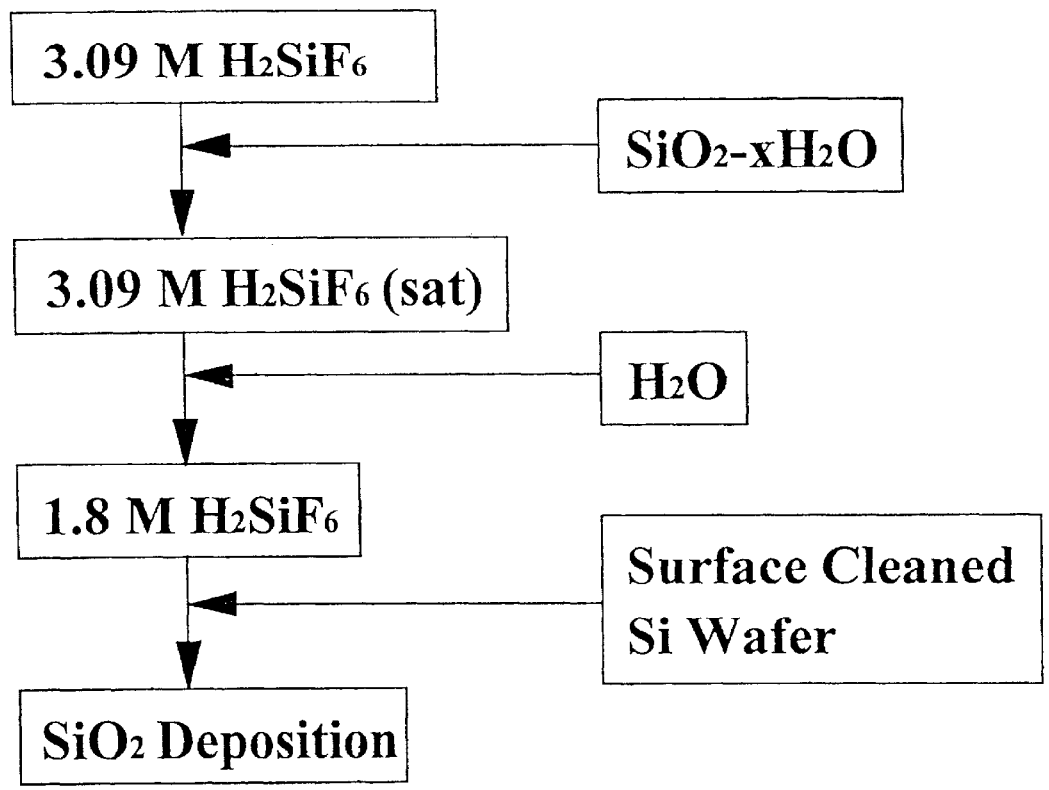
Figure 2:
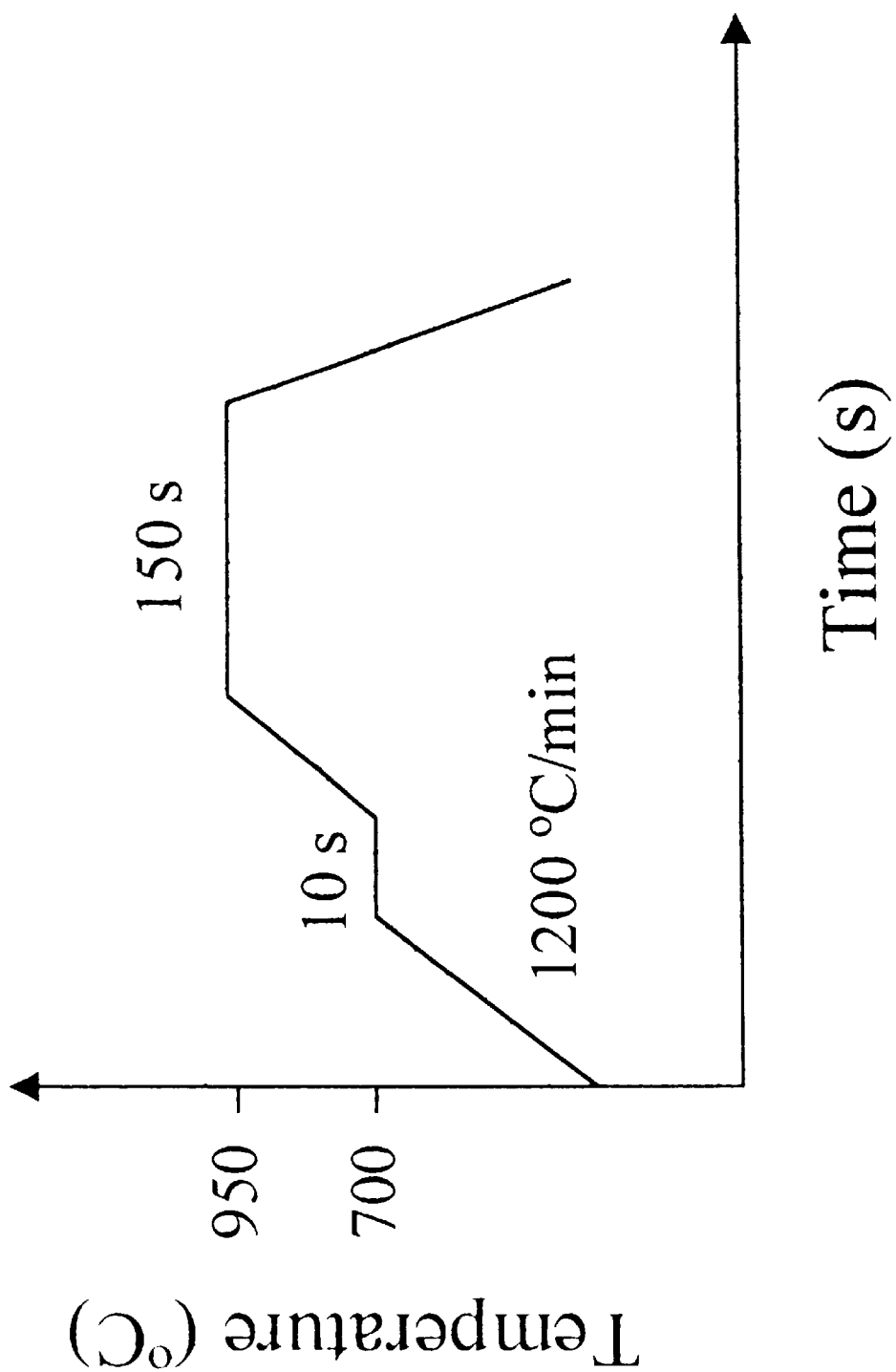
Figure 3:
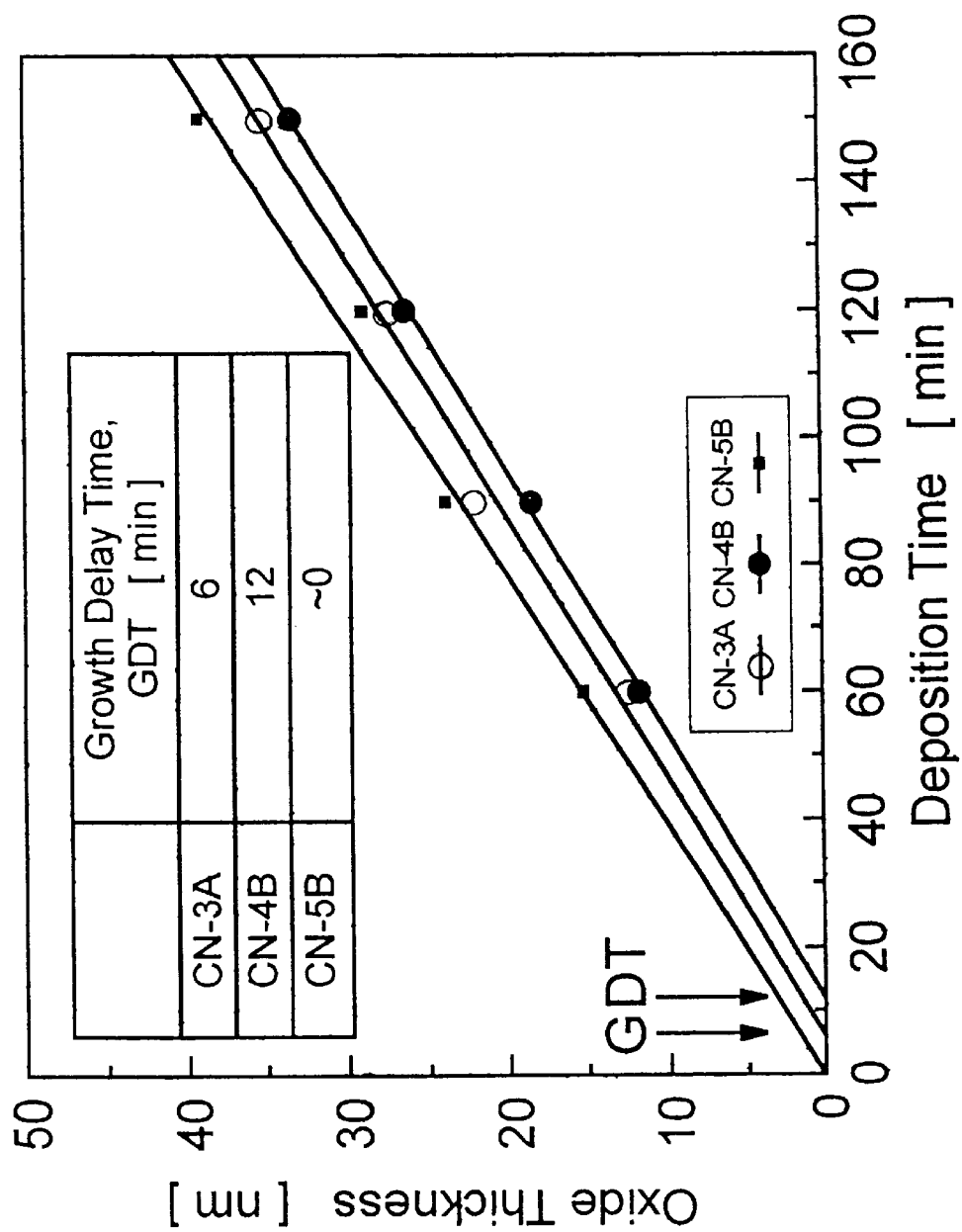

Table 2 Percentage increment of breakdown field.
Table 3 Percentage reduction of interface trap density.
Figures:
FIG. 1 Schematic illustration of the preparation process for liquid-phase deposition solution.
FIG. 2 Schematic illustration of temperature-raising model.
FIG. 3 Schematic illustration of the growth curves of liquid-phase deposition.

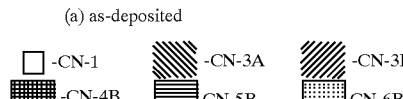
-○-CN-3A   -●-CN-4B   -■-CN-5B

Figure 4A:
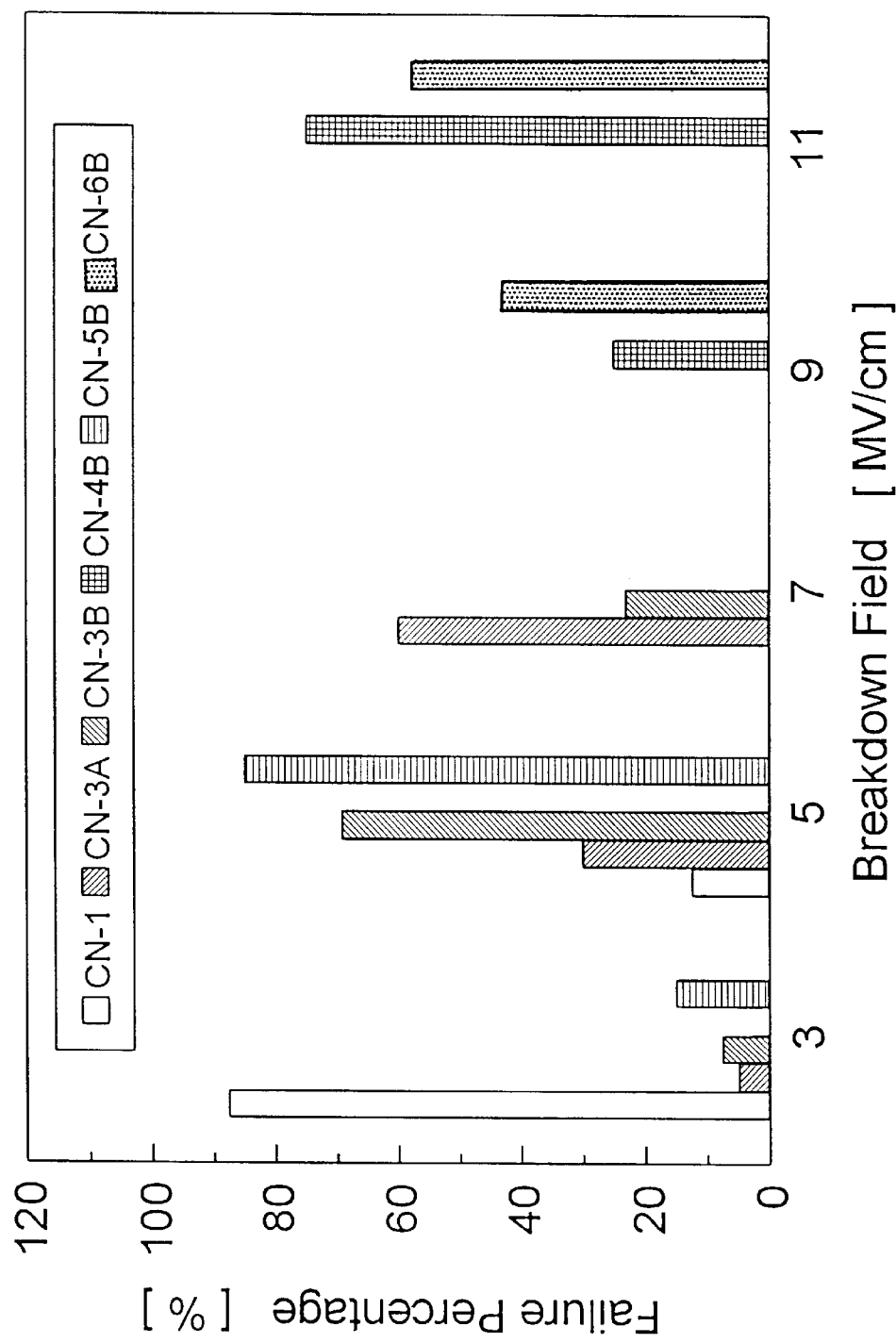
Figure 4B:
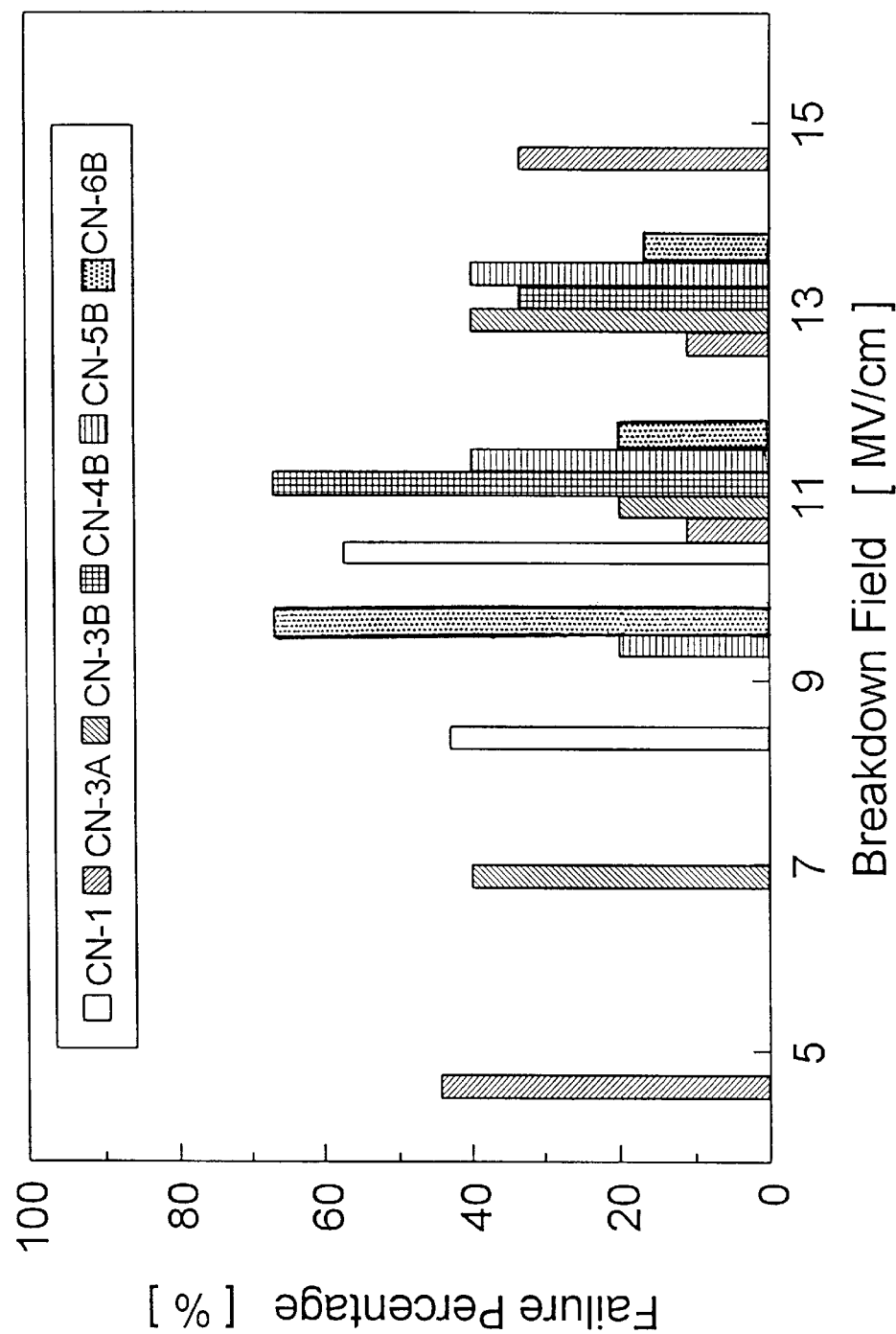

FIG. 4 Schematic illustration of the breakdown field distribution.

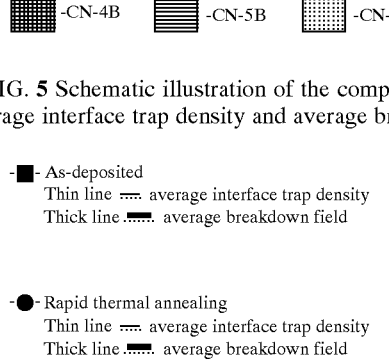

(a) as-deposited

□ -CN-1     -CN-3A    -CN-3B
-CN-4B      CN-5B     CN-6B (b) rapid thermal annealing

□ CN-1      CN-3A     --CN-3B
-CN-4B      -CN-5B    -CN-6B

Figure 5:
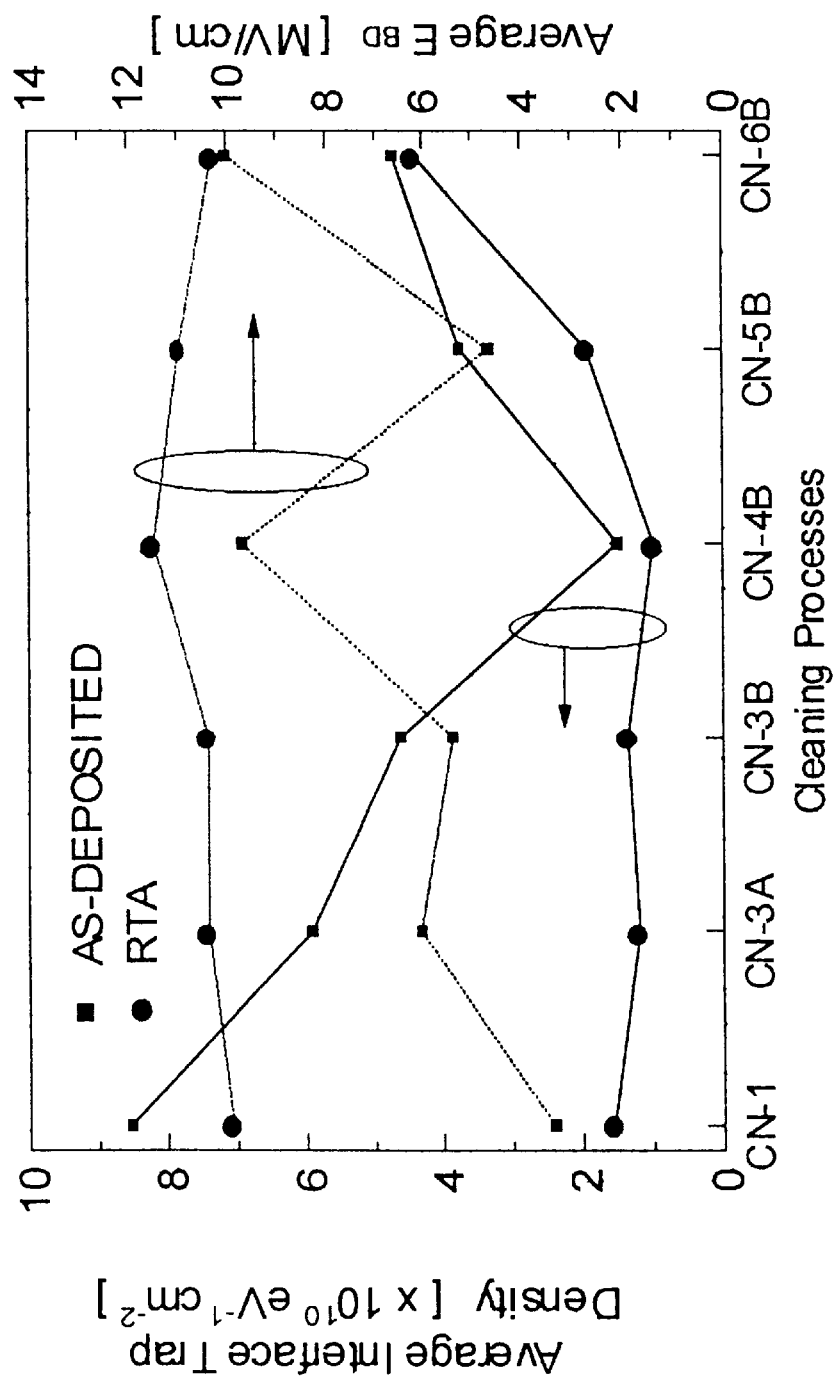

FIG. 5 Schematic illustration of the comparison between average interface trap density and average breakdown field.

Figure 6:
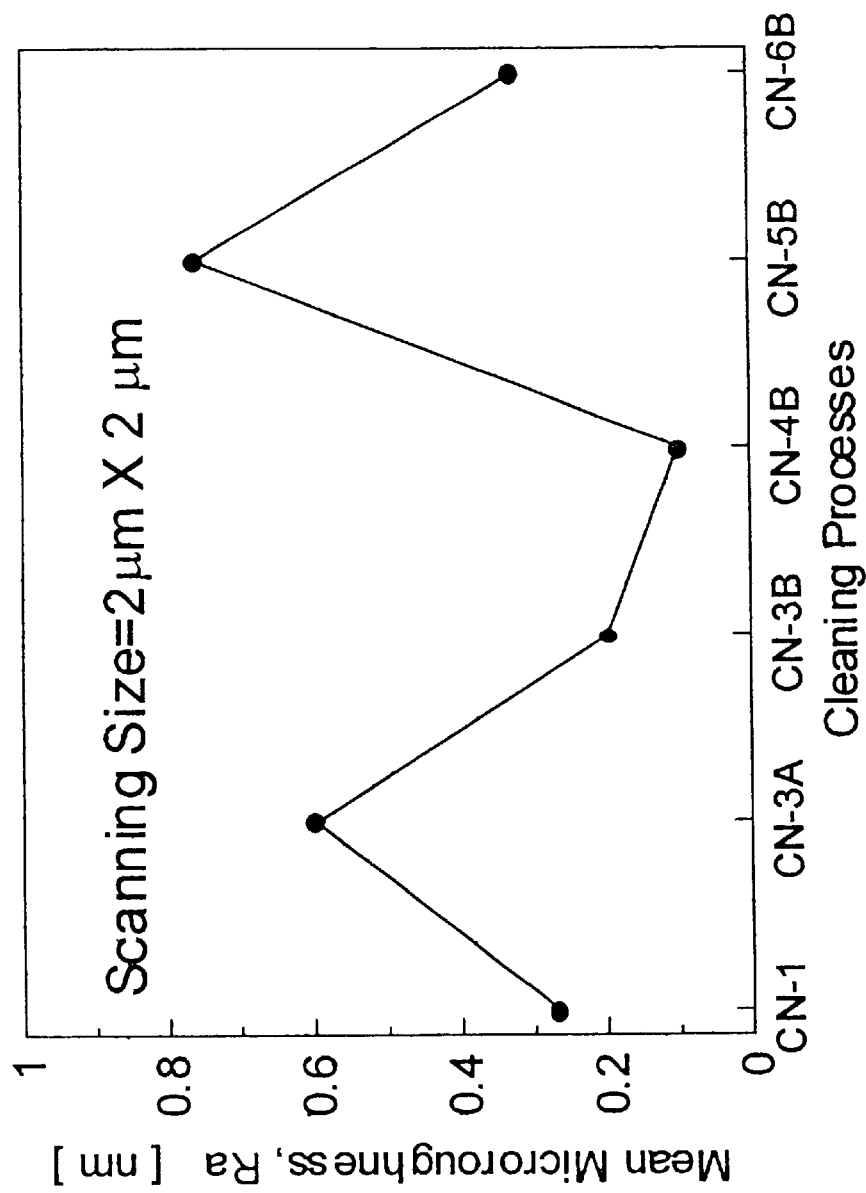

-■- As-deposited
    Thin line ─── average interface trap density
    Thick line ▬▬▬ average breakdown field -●- Rapid thermal annealing
    Thin line ─── average interface trap density
    Thick line ▬▬▬ average breakdown field FIG. 6 Schematic illustration of the mean microroughness (Ra) of different surface treatments.

DETAILED DESCRIPTION OF THE INVENTION

The standard RCA cleaning method is first used to clean the silicon (Si) surface, then two-step hydrogen fluoride (HF) etching technique is applied to treat silicon (Si) wafer followed by nitrogen gas drying and liquid-phase deposition. In the deposition process, saturated hydrofluosilicic acid ($H_2SiF_6$) is diluted with water to form the growth solution. Under constant temperature of 30° C., an oxide layer of approximate thickness of 10 nm will be grown on Si. Rapid thermal annealing technique will then remove the fluorine ions ($F^-$) and densify the deposited oxide layers.

Our invention uses wet etching method to treat the surface of silicon (Si) wafer. The wafers used are n-type silicon (Si) with (100) orientation and specific resistance of 9~12 Ω-cm. Pre-cleaning is via standard RCA cleaning methods. The procedure is as follows:

1) The wafer is boiled in ammonia hydrogen peroxide mixture (APM) solution at 80° C. for 15 minutes to remove organic impurities. APM solutions is prepared by mixing ammonia water ($NH_4OH$), hydrogen peroxide ($H_2O_2$), and water in the ratio of 0.05:10:50. The traditional ratio of ammonia water ($NH_4OH$) of 10 has been shown to cause server roughness on the Si surface. Thus in our invention, the ratio of ammonia has been reduced to 0.05 to minimize surface microroughness within our control.

2) The wafer is left in ultrapure deionized water (19 Ω-cm) for 5 minutes to remove all residuals of APM solution.

3) Then the wafer is boiled in 80° C. hydrochloric hydrogen peroxide mixture (HPM solution) solution for 15 minutes to remove metallic ions. The preparation of HPM solutions is by mixing hydrogen chloride (HCl (l)): hydrogen peroxide ($H_2O_2$): water in the ratio of 10:10:60.

4) The wafer is again cleaned in ultrapure deionized water (19 MΩ-cm) for 5 minutes to remove all residuals of HPM solution.

5) The cleaned wafer is placed into different etching solution as is shown in Table 1. The purpose of these solutions is to completely remove chemically formed oxide during RCA cleaning and to produce large quantity of hydrogen bonds on silicon (Si) surface. This step will allow the subsequent deposited oxide layer to bind tightly with silicon (Si) surfaces and form high quality fluorinated silicon oxides (SiOF).

The different etching solutions in Table 1 of our invention, ie., two-step hydrogen fluoride (HF) etching method, which uses six different types of silicon (Si) surface etching solution to determine the improvement in the characteristics of silicon oxides/silicon ($SiO_2$/Si) interface.

Most point to note for is that compared to the experimental group CN-1, the best etching method CN-4B of our invention is found when nitrogen gas drying is followed immediately by the last diluted hydrogen fluoride (HF) etching instead of cleaning in ultrapure deionized water. The reason is that ultrapure deionized water will damage the hydrogen bonds on silicon (Si) surface, causing the native oxide to grow continuously. The ultrapure deionized water cleaning is also omitted in the experimental group CN-3A, CN-5B, and CN-6B.

The preparation process for the solution of liquid-phase deposition is shown in FIG. 1. Our invention has diluted saturated hydrofluosilicic acid ($H_2SiF_6$) of 3.09 mole/l to 1.8 mole/l with suitable ultrapure deionized water to form the growth solution, and under constant temperature of 30° C., oxide layer of approximately 10 nm was grown. The important point is that once silicon wafers have been treated by the above-mentioned etching solutions, they are immediately placed into growth solution to avoid native oxide from growing again.

MOS devices are determined on the oxide-grown wafers via photolithography method. Aluminum (Al) will be evaporated via thermal evaporator onto the wafers and using lift-off technique to form the top metal. Similar method is used to deposit aluminum onto the back of wafer that the oxide layer has been removed, followed by heating in the quartz furnace tube at 400° C. under nitrogen gas ($N_2$) environment for 30 minutes to form good ohmic contact.

Rapid thermal annealing procedure is to allow wafers with oxide layer to be placed in infrared furnace at 950° C. under nitrogen gas ($N_2$) environment for 150 seconds. The temperature-raising rate is shown in FIG. 2.

In electrical characterization, high frequency capacitance-voltage curve is used to measure the interface charge density, and HP4156A is used to measure the current-voltage curve. The DC ramp rate is 0.2 V/s and is determined via positive gate bias. Breakdown field is defined as the leakage current reached 10 mA/cm² or catastrophic breakdown. Surface microroughness after etching is detected by scanning the wafer surface using atomic force microscopy.

FIG. 3 is the growth curve of the liquid-phase deposition, which shows that the etched wafer surface has to undergo a series of surface reaction to produce conditions supportive to deposition, ie. Si-OH (oxyhydrogenated silicon bond) could form the first oxide layer, followed by continuous deposition of LPD oxides. For example in CN-3A experimental group, a deposition time of 150 minutes is sufficient to grow an oxide layer of 35.3 nm thick, and 33.3 nm thick for CN-4B experimental group. FIG. 3 represents the growth curves of liquid-phase deposition and from this diagram, growth delay time (GDT) is clearly shown, where CN-3A experimental group requires approximately 6 minutes and for CN-4B experimental group, which has the longest two-step hydrogen fluoride (HF) etching, take about 12 minutes. The reason is that the silicon (Si) surface has the most hydrogen bonds and these bonds will produce oxy-hydrogenated silicon bond (Si-OH) through the following reactions:

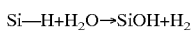

However growth delay time for CN-5B experimental group is almost zero, and it is because of the oxidation between nitric acid ($HNO_3$) and silicon (Si). For CN-6B experimental group, as ultrapure deionized water is replaced by hydrogen peroxide ($H_2O_2$), thus suppressing the oxidation between nitric acid ($HNO_3$) and silicon (Si) which resulted in fewer oxide layers and longer growth delay time than CN-5B experimental group.

FIG. 4 shows the distribution of breakdown field after different surface treatment. From this figure, the breakdown field could be found being distributed between 3 MV/cm and 11 MV/cm. A lower breakdown field indicates that there is a presence of impurities in the oxide layer. The naturally incorporated fluorine ions ($F^-$) during liquid-phase deposition causes this phenomenon. The oxide layers that were treated with rapid thermal annealing will have a higher breakdown field about 10 MV/cm, some could even reach 15 MV/cm. Such characteristics reached about 4.4~9.6 MV/cm are much better than the oxide layers cleaned by plasma etching. The reason for this improvement is that rapid thermal annealing could effectively remove the fluorine ions, allowing the oxide layer to be denser, and also reduces the oxygen vacancies and oxy-hydrogenated silicon bonds (Si-OH). Rapid thermal annealing (RTA) could also be applied to this technique, as shown in Table 2, where the breakdown field of CN-4B (as-deposited) is used as a standard, and it can be noted that after rapid thermal annealing, it has an 18% increment. In Table 3 indicating the interface trap density of different experimental groups, the interface trap density of CN-4B (as-deposited) is used as a standard, and it can be noted that after rapid thermal annealing, the interface trap density of CN-4B is reduced by 33%.

This value is obtained by deducting the value obtained immediately after deposition from the value of rapid thermal annealing (breakdown field or interface charge), then divided with the value obtained immediately after deposition and multiply by 100%.

[{Breakdown fields [rapid thermal annealing]—breakdown field [immediately after deposition]}/breakdown field [immediately after deposition]]×100%

FIG. 5 represents the comparison between average interface trap density and average breakdown field (Average $E_{BD}$, MV/cm) of different surface treatment. Experimental group CN-4B was shown to have the lowest interface density and highest breakdown field in both as-deposited and after RTA of oxide layers. By comparing with experimental group CN-1, it is observed that higher hydrogen fluoride (HF) concentration and longer treatment time, a more complete passivation of hydrogen bond on Si could be obtained. By mixing hydrogen fluoride (HF) and water in a ratio of 1:200, the surface microroughness could be reduced, thus improving the electrical characteristics. In rapid thermal annealing, improvement have been obtained as the bonding strength has been increased for all oxide layers where the interface density of all oxide layers is less than $5\times10^{10}$ $eV^{-1}cm^2$, and the average breakdown field is between the range of 10~11 MV/cm.

FIG. 6 shows the mean microroughness (Ra) of different surface treatment. The surface microroughness (Ra) of experimental group CN-4B is 0.1 nm and the largest Ra value is 0.761 nm from CN-5B. Therefore, it is clear that two-step hydrogen fluoride (HF) etching technique could effectively reduce surface microroughness. By comparing with FIG. 5, it is observed that microroughness has direct effect on breakdown field. This results in a higher Ra value (0.1~1 nm) than other surface cleaning techniques. From other publications, it has been observed that when the thickness of oxide layer is less than 8 nm, the microroughness of silicon (Si) surface would increase, decreasing the thickness of localized areas on oxide layers, causing greater leakage current in these areas. In conclusion, our invention could effectively treat silicon (Si) surface, and assist in subsequent oxide layer growth of high quality.

Our invention will help in depositing high quality and low cost oxide layer that can be applied to ultra thin gate oxide of future ULSI devices.

Example 1

Standard RCA Cleaning

Boil wafer in 80° C. APM solution ($NH_4OH:H_2O_2:H_2O=$ 0.05:10:50) for 15 minutes to remove organic impurities. Leave wafer in ultrapure deionized water (19 MΩ-cm) for 5 minutes to remove all residuals of APM. Then boil the wafer in HPM solution at 80° C. for 15 minutes to remove metallic ions. The HPM solution is prepared by mixing 36% hydrogen chloride (HCl(l)), 30% hydrogen peroxide ($H_2O_2$) and water in the ratio of 10:10:60.

Leave the wafer in ultrapure deionized water (19 MΩ-cm) for 5 minutes to remove all residuals of HPM solution.

Example 2

CN-1 Cleaning Procedure

Use standard RCA cleaning procedure described at Example 1 as the pre-cleaning treatment, then etch for 15 seconds in 48% hydrogen fluoride (HF) and water solution in a ratio of 1:40 before boiling in 80° C. HPM solution for 5 minutes, and dry with nitrogen gas. The HPM solution is prepared by mixing 36% HCl(l), 30% hydrogen peroxide ($H_2O_2$) and water in a ratio of 10:10:60.

Example 3

CN-3A Cleaning Procedure

Use standard RCA cleaning procedure described at Example 1 as the pre-cleaning treatment, then etch for 30 seconds in 48% hydrogen fluoride (HF) and methanol (MeOH) solution in a ratio of 1:10, and then dry with nitrogen gas.

Example 4

CN-3B Cleaning Procedure

Use standard RCA cleaning procedure described at Example 1 as the pre-cleaning treatment, then etch for 30 seconds in 48% hydrogen fluoride (HF) and water solution in a ratio of 1:10 before boiling in 80° C. HPM solution for 5 minutes, and dry with nitrogen gas. The HPM solution is prepared by mixing 36% HCl (l), 30% hydrogen peroxide ($H_2O_2$) and water in a ratio of 10:10:60.

Example 5

CN-4B Cleaning Procedure

Use standard RCA cleaning procedure described at Example 1 as the pre-cleaning treatment, then etch for 2 minutes in 48% hydrogen fluoride (HF) and water solution in a ratio of 1:200 before boiling in 80° C. HPM solution for 5 minutes. The HPM solution is prepared by mixing 36% HCl (l), 30% hydrogen peroxide ($H_2O_2$) and water in a ratio of 10:10:60.

Etch for 2 minutes in the mixed solution of HF (l) and ultrapure deionized water ($H_2O_2$) that is prepared by mixing 48% HF (l), and water in a ratio of 1:200. And then dry with nitrogen gas.

Example 6

CN-5B Cleaning Procedure

Use standard RCA cleaning procedure described at Example 1 as the pre-cleaning treatment, then etch for 2 minutes in 48% hydrogen fluoride (HF) and water solution in a ratio of 1:200 before boiling in 80° C. HPM solution for 5 minutes. The HPM solution is prepared by mixing 36% HCl (l), 30% hydrogen peroxide ($H_2O_2$) and water in a ratio of 10:10:60.

Etch for 5 minutes in the mixed solution of nitric acid (l), hydrogen fluoride (HF), and water that is prepared by mixing 70% $HNO_3$(l), 48% hydrogen fluoride (HF) and water in a ratio of 60:0.1:39.9. And then dry with nitrogen gas.

Example 7

CN-6B Cleaning Procedure

Use standard RCA cleaning procedure described at Example 1 as the pre-cleaning treatment, then etch for 2 minutes in 48% hydrogen fluoride (HF) and water solution in a ratio of 1:200 before boiling in 80° C. HPM solution for 5 minutes. The HPM solution is prepared by mixing 36% HCl (l), 30% hydrogen peroxide ($H_2O_2$) and water in a ratio of 10:10:60.

Etch for 5 minutes in the mixed solution of nitric acid $HNO_3$(l), hydrogen fluoride (HF), and hydrogen peroxide ($H_2O_2$) that is prepared by mixing 70% $HNO_3$(l), 48% hydrogen fluoride (HF) and hydrogen peroxide ($H_2O_2$) in a ratio of 50:0.5:49.5. And then dry with nitrogen gas.

TABLE 1

Six different types of surface etching solutions for Si.

| | |
|---|---|
| CN-1 | RCA*→hydrogen fluoride (HF)#: $H_2O$ = 1:40 (15 sec)→D.I.(5 min)→Dried. |
| CN-3A | RCA*→hydrogen fluoride (HF)#: MeOH = 1:10 (30 sec)→Dried. |
| CN-3B | RCA*→hydrogen fluoride (HF)#: MeOH = 1:10 (30 sec)→D.I.(5 min)→Dried. |
| CN-4B | RCA*→hydrogen fluoride (HF)#: $H_2O$ = 1:200 (2 min)→D.I.(5 min)→hydrogen fluoride (HF)#: $H_2O$ = 1:200 (2 min)→Dried. |

TABLE 1-continued

Six different types of surface etching solutions for Si.

| | |
|---|---|
| CN-5B | RCA*→hydrogen fluoride (HF)#: $H_2O$ = 1:200 (2 min)→D.I.(5 min)→$HNO_3$: hydrogen fluoride (HF)#: $H_2O$ = 60:0.1:39.9 (5 min) →Dried. |
| CN-6B | RCA*→hydrogen fluoride (HF)#: $H_2O$ = 1:200 (2 min)→D.I.(5 min)→$HNO_3$: hydrogen fluoride (HF)#: hydrogen peroxide ($H_2O_2$) = 50:0.5:49.5 (3 min)→Dried. |

*RCA: aminonia water ($NH_4OH$)/hydrogen peroxide ($H_2O_2$)/$H_2O$ (0.05:10:50)→ D.I. →hydrogen chloride (HCl)/hydrogen peroxide ($H_2O_2$)/$H_2O$ (10:10:60).
hydrogen fluoride (HF): 48%, other solvent concentration are: ammonia water ($NH_4OH$): 28%; hydrogen chloride (HCl): 36%; hydrogen peroxide ($H_2O_2$): 30%; $HNO_3$: 70%.

TABLE 2

Percentage increment of breakdown field for as-deposited and rapid thermal annealed samples

| | Breakdown Field (MV/cm) | | |
|---|---|---|---|
| | As-deposited | Rapid Thermal Annealed | Increment (%) |
| CN-1 | 3.38 | 9.88 | 192 |
| CN-3A | 6.05 | 10.37 | 71.4 |
| CN-3B | 5.39 | 10.38 | 92.6 |
| CN-4B | 9.705 | 11.47 | 18.2 |
| CN-5B | 4.65 | 10.96 | 135.6 |
| CN-6B | 10.02 | 10.29 | 2.7 |

TABLE 3

Percentage reduction of interface trap density for as-deposited and rapid thermal annealed samples

| | Interface Trap Density ($\times 10^{10}$ $eV^{-1}cm^{-2}$) | | |
|---|---|---|---|
| | As-deposited | Rapid Thermal annealed | Reduction (%) |
| CN-1 | 8.53 | 1.56 | 81.7 |
| CN-3A | 5.93 | 1.18 | 80.1 |
| CN-3B | 4.62 | 1.34 | 71 |
| CN-4B | 1.5 | 1 | 33.3 |
| CN-5B | 3.74 | 1.93 | 48.4 |
| CN-6B | 4.73 | 4.4 | 6.97 |

What is claimed is:

1. A silicon (Si) surface treatment method to improve the electrical characteristics of silicon oxides ($SiO_2$), said method comprising the steps of:
    cleaning the silicon (Si) surface of a plurality of silicon wafers with standard RCA cleaning procedure;
    treating the plurality of silicon wafers with two-step hydrogen fluoride (HF) etching technique and dry with nitrogen gas;
    immersing said plurality of silicon wafers in a growth solution prepared by diluting 3.09 mole/l saturated hydrofluosilicic acid ($H_2SiF_6$) to grow oxide layers to approximately 10 nm at constant temperature of 30° C.; and
    rapid thermal annealing said plurality of silicon wafers.

2. The silicon (Si) surface treatment method to improve the electrical characteristics of silicon oxides ($SiO_2$), according to claim 1, the two-step hydrogen fluoride (HF) etching technique is used for 2 minute in 48% hydrogen fluoride (HF) and water solution in a ratio of 1:200, then boiling in 80° C. HPM solution for 5 minutes, said HPM solution being prepared by mixing 36% HCl (l), 30% hydrogen peroxide ($H_2O_2$) and water in a ratio of 10:10:60.

3. The silicon (Si) surface treatment method to improve the electrical characteristics of silicon oxides ($SiO_2$) according to claim 1, said growth solution being dilute saturated hydrofluosilicic acid ($H_2SiF_6$) of 3.09 mole/l concentration into 1.8 mole/l with suitable water.

4. The silicon (Si) surface treatment method to improve the electrical characteristics of silicon oxides ($SiO_2$), according to claim 1, the rapid thermal annealing step comprises placing said plurality of wafers in an infrared furnace at 950° C. under $N_2$ environment for 150 seconds.

5. A method for applying a high quality silicon oxide layer to a silicon wafer, said method comprising the steps of:
  cleaning said silicon wafer using a standard RCA process;
  treating said silicon wafer with HF etching;
  drying said wafer in nitrogen gas;
  preparing a liquid phase fluorinated silicon dioxide growth solution;
  placing said wafer in said growth solution for a predetermined time to grow a silicon dioxide layer of a predetermined thickness; and
  rapid thermal annealing said silicon wafer having a layer of silicon dioxide grown thereon.

6. The method of claim 5, said HF etching step comprising the steps of:
  placing said wafer in a HF:$H_2O$=1:200;
  rinsing said wafer with deionized water;
  placing said wafer in HF:$H_2O$=1:200; and
  drying said wafer with nitrogen gas.

7. The method of claim 5, said HF etching step comprising the steps of:
  placing said wafer in HF:$H_2O$=1:40;
  rinsing said wafer with deionized water; and
  drying said wafer with nitrogen gas.

8. The method of claim 5, said HF etching step comprising the steps of:
  placing said wafer in HF:MeOH=1:10; and
  drying said wafer with nitrogen gas.

9. The method of claim 5, said HF etching step comprising the steps of:
  placing said wafer in HF:MeOH=1:10;
  rinsing said wafer with deionized water; and
  drying said wafer with nitrogen gas.

10. The method of claim 5, said HF etching step comprising the steps of:
  placing said wafer in HF:$H_2O$=1:200;
  rinsing said wafer with deionized water;
  placing said wafer in $HNO_3$:HF:$H_2$=60:0.1:39.9; and
  drying said wafer in nitrogen gas.

11. The method of claim 5, said HF etching step comprising the steps of: placing said wafer in HF:$H_2$=1:200;
  rinsing said wafer with deionized water;
  placing said wafer in $HNO_3$:HF:$H_2O_2$=50:0.5:49.5; and
  drying said wafer in nitrogen gas.

12. The method of claim 5, said rapid thermal annealing occurring at 950 degrees Celsius in nitrogen gas for 150 seconds.

13. The method of claim 5, said RCA process comprising the steps of:
  boiling said wafer in $NH_4OH$:$H_2O_2$:$H_2O$=0.05:10:50;
  rinsing said wafer in ultrapure deionized water;
  boiling said wafer in HCl:$H_2O_2$:$H_2O$=10:10:60; and
  rinsing said wafer with ultrapure deionized water.

14. The method of claim 6, said rapid thermal annealing occurring at 950 degrees Celsius in nitrogen gas for 150 seconds.

15. The method of claim 13, said RCA process comprising the steps of:
  boiling said wafer in $NH_4OH$:$H_2O_2$:$H_2O$=0.05:10:50;
  rinsing said wafer in ultrapure deionized water;
  boiling said wafer in HCl:$H_2O_2$:$H_2O$=10:10:60; and
  rinsing said wafer with ultrapure deionized water.

16. A method for preparing a silicon wafer for liquid phase deposited silicon oxide growth, said method comprising the steps of:
  performing a standard RCA clean on said silicon wafer; and
  performing an HF etch on said wafer to remove oxides formed during said RCA clean.

17. The method of claim 16, said HF etch comprising the steps of:
  placing said wafer in a HF:$H_2O$=1:200 for 2 minutes;
  rinsing said wafer with deionized water for 5 minutes;
  placing said wafer in HF:$H_2O$=1:200 for 2 minutes; and
  drying said wafer with nitrogen gas.

18. The method of claim 16, said HF etch comprising the steps of:
  placing said wafer in HF:$H_2O$=1:200 for 2 minutes;
  rinsing said wafer with deionized water for 5 minutes;
  placing said wafer in $HNO_3$:HF:$H_2O$=60:0.1:39.9 for 5 minutes; and
  drying said wafer in nitrogen gas.

19. The method of claim 16, HF etch comprising the steps of:
  placing said wafer in HF:MeOH=1:10;
  rinsing said wafer with deionized water; and
  drying said wafer with nitrogen gas.

* * * * *